(12) United States Patent
Imura

(10) Patent No.: US 6,838,215 B2
(45) Date of Patent: Jan. 4, 2005

(54) GRAYTONE MASK PRODUCING METHOD, GRAYTONE MASK AND PATTERN TRANSFER METHOD

(75) Inventor: Kazuhisa Imura, Kumamoto (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/255,069

(22) Filed: Sep. 26, 2002

(65) Prior Publication Data

US 2003/0077522 A1 Apr. 24, 2003

(30) Foreign Application Priority Data

Sep. 28, 2001 (JP) .................................... P.2001-304456
Sep. 2, 2002 (JP) .................................... P.2002-256531

(51) Int. Cl.[7] .............................. G03F 9/00; G03F 7/00
(52) U.S. Cl. ............................. 430/5; 430/30; 430/322; 427/240; 118/401
(58) Field of Search .............................. 430/5, 22, 30, 430/322; 427/240; 118/401

(56) References Cited

U.S. PATENT DOCUMENTS

| | | | | |
|---|---|---|---|---|
| 4,902,899 A | * | 2/1990 | Lin et al. ....................... | 430/5 |
| 5,219,615 A | * | 6/1993 | Nakazawa et al. ........... | 427/240 |
| 5,650,196 A | | 7/1997 | Muhlfriedel et al. | |
| 5,654,041 A | * | 8/1997 | Appich et al. ............ | 427/434.5 |
| 5,665,496 A | * | 9/1997 | Omika et al. ................... | 430/7 |
| 5,900,273 A | * | 5/1999 | Rasmussen et al. ........... | 427/58 |
| 6,440,634 B1 | * | 8/2002 | Ohsawa et al. ........... | 430/270.1 |
| 2002/0004100 A1 | * | 1/2002 | Gurer et al. ................ | 427/240 |

FOREIGN PATENT DOCUMENTS

| | | |
|---|---|---|
| JP | 8-328235 A | 12/1996 |
| JP | 2000-075466 A | 3/2000 |
| JP | 2000-295232 | * 8/2001 |

OTHER PUBLICATIONS

FPD Intelligence, May, 1999.
Korean Office Action for Patent Application No. 2002–58830, dated Jun. 30, 2004.

* cited by examiner

Primary Examiner—Mark F. Huff
Assistant Examiner—Kripa Sagar
(74) Attorney, Agent, or Firm—Sughrue Mion, PLLC

(57) ABSTRACT

A method for producing a graytone mask capable of satisfying a dimensional accuracy of a predetermined graytone pattern, on a graytone mask having, at least in a part, a predetermined graytone pattern. Suppressed to ±1% or less an on-plane distribution in thickness of a resist film to be applied onto a substrate in a graytone mask producing process.

3 Claims, 3 Drawing Sheets

GRAYTONE MASK PRODUCING METHOD, GRAYTONE MASK AND PATTERN TRANSFER METHOD

BACKGROUND OF THE INVENTION

The present invention relates to a method for producing a graytone mask having a graytone part to obtain light transmission in an intermediate amount of between an opaque part and light-transmission part.

In recent years, attempts have been made to reduce the number of mask sheets by using graytone masks in the process for making TFT (Thin Film Transistor) in the field of large-sized LCD masks (as set forth in the monthly FPD Intelligence, May, 1999).

As shown in FIG. 8A, such a graytone mask has an opaque part 1, a transmission part 2 and a graytone part 3. The graytone part 3 corresponds to an area in which there is formed an opaque pattern 3a of below or equal to the resolution limit of an exposure apparatus for a large-sized LCD using the graytone mask and is designed to selectively change the thickness of a photoresist film by decreasing the light transmitted through this area so as to decrease the amount of irradiation due to the area. Normally, the opaque part 1 and the opaque pattern 3a are formed with films that are made of the same material such as chromium (Cr) or a chromium compound and have the same thickness.

The resolution limit of the exposure apparatus for the large-sized LCD using the graytone mask is about 3 $\mu$m in the case of an exposure apparatus of a stepper type and about 4 $\mu$m in the case of an exposure apparatus of a mirror projection type. Consequently, the space width of a transmission part 3b in the graytone part of FIG. 8A is set at less than 3 $\mu$m and the line width of the opaque pattern 3a of below or equal to the resolution-limit of the exposure apparatus is set at less than 3 $\mu$m, for example. When the exposure apparatus for the large-sized LCD is used for light exposure, as the exposure light transmitted through the graytone part 3 as a whole is deficient in the amount of light exposure, positive photoresist are left on a substrate though the thickness of the positive photoresists exposed to light via the graytone part 3 solely decreases. This phenomenon is called as graytone effect. More specifically, there arises a difference in solubility of resists in developing liquid between parts corresponding to the ordinary opaque part 1 and to the graytone part because of difference in the amount of light exposure and this results in, as shown in FIG. 8B, making a part 11 corresponding to the ordinary opaque part 1 as thick as about 1.3 $\mu$m, making a part 13 corresponding to the graytone part 3 as thick as about 0.3 $\mu$m and making a part corresponding to the transmission part 2 a part 12 without resists, for example. A first etching of a substrate as a workpiece is carried out in the part 12 without the resists. Then, the resists in the thin part 13 corresponding to the graytone part 3 are removed by ashing and the like and a second etching of this part is carried out. The etching processes are performed with one mask instead of two masks as conventionally used in order to reduce the number of masks for use.

In producing a graytone mask of the above type, an opaque film is formed of chromium, a chromium compound or the like over a glass substrate. A resist film is formed thereon, most commonly, by a spin coat technique, and then patterning is done with the pattern data including graytone pattern data to develop the resist film, thereby forming a resist pattern. This resist pattern is used as a mask to etch the opaque film, followed by stripping away the resist pattern.

In the graytone mask, because the amount of light transmission through the graytone part is controlled by the dimensions of a graytone pattern, dimensional accuracy is required strictly on the graytone pattern. Namely, in case there are variations in linewidth dimensions in the graytone pattern on a substrate surface, variations of transmissivity occur in the graytone region. It can be considered, as one method for preventing such variations in plane pattern dimensions, to use a resist film having less variations in film thickness in order for forming a graytone pattern. However, in applying resist by the spin coat technique most commonly employed in the conventional, the resist film inevitably rises at the substrate peripheral edge by rotation. There has been a problem that there is limitation in reducing the on-plane variations of resist-film thickness due to the effect of rise at the peripheral edge or the like. Particularly, in producing a graytone mask for a display device necessarily using a large-sized substrate of 330 mm or greater in one side, there is difficulty in producing a resist mask evenly throughout the large area thereof.

SUMMARY OF THE INVENTION

It is an object of the present invention to provide a method to fabricate a graytone mask reduced in on-plane pattern dimensional variations.

The present inventor has eagerly conducted a research and development in order to eliminate the problem, and resultingly found that an on-plane distribution of resist film thickness must be suppressed to ±1% or less in a region for forming at least a graytone part of a resist film in order to satisfy a dimensional accuracy (on-plane distribution) of a graytone pattern.

By suppressing the on-plane distribution of resist film thickness to ±1% or less, the on-plane variations of dimensional accuracy is improved by approximately 20%, thus reducing the variations of light transmissivity in the graytone part. As a result, it was found to conspicuously improve the yield in the pattern transfer process using such a graytone mask and to remarkably enhance the applicability of the pattern transfer process using the graytone mask.

Note that the on-plane distribution of resist-film thickness is defined as plane distribution (%)=(Tmax−Tmin)/(TAverage×2)×100 provided that the maximum film thickness is Tmax, the minimum film thickness is Tmin and the average film thickness is TAverage as resist film thickness is measured at a plurality of points on one mask.

Meanwhile, in the invention, the measuring area on resist film thickness is a region to form a graytone part. In the case of a graytone mask including a multiplicity of pixel patterns including graytone parts as in a graytone mask for producing a display device, the measuring area is assumably a pixel area (area to form a pixel pattern). In the case of including graytone parts in a region other than the pixel area, it is assumably a region including that region.

The present invention has the following features.

A method for producing a graytone mask having an opaque part, a light-transmission part and a graytone part as a region formed with an opaque pattern having pattern dimensions equal to or smaller than a resolution limit of a exposing apparatus using a mask to reduce an amount of exposure light transmission through the region, the method for forming a graytone mask characterized by:

suppressing an on-plane distribution of resist film thickness to ±1% or less in a region where a graytone part is formed by a resist film applied on a substrate in a forming process of a graytone mask.

A method for producing a graytone mask as mentioned above, wherein the resist film is applied with a resist liquid raised using a capillary phenomenon through a capillary nozzle, by scanning a nozzle tip over the substrate held downward.

A graytone mask for display device fabrication obtained by a forming method as mentioned above.

A pattern transfer method using a graytone mask above mentioned.

According to the invention, by suppressing the on-plane distribution of resist film thickness to ±1% or less, a predetermined graytone pattern dimensional accuracy (on-plane variations) can be satisfied for a graytone mask having, at least in a part, a predetermined graytone pattern. Thus, realized is a graytone mask partly having, at least in a part, a predetermined graytone pattern having a less light-transmissivity distribution.

By suppressing the on-plane distribution of resist film thickness to ±1% or less, the on-plane variations of dimensional accuracy is improved by approximately 20%. In the case a pattern is transferred onto the resist by the use of a graytone mask, the graytone part is conspicuously improved in resist film thickness variations in the entire region thereof. Accordingly, it is possible to conspicuously improve the yield in a pattern transfer process using a graytone mask and remarkably enhance the applicability of the pattern transfer process using a graytone mask.

Incidentally, the on-plane distribution of resist film thickness is, more preferably, suppressed to ±0.8% or less, further preferably to ±0.5% or less.

According to Structure 2, instead of a spin coater as the mainstream of resist coaters, used is an apparatus of a scheme to apply a resist liquid, raised using a capillary phenomenon through a capillary nozzle, onto a substrate held downward by scanning a nozzle tip over the substrate. Due to this, no resist-film rise is formed at a peripheral edge on the substrate. Even for a large-sized substrate, the on-plane distribution of resist film thickness can be suppressed to ±1% or less, with reproducibility and yield, over a broad range on the substrate. Accordingly, it is to fabricate, with yield, a greytone mask having a graytone part reduced in dimensional accuracy (plane variations).

Namely, in the invention, a CAP coater is applicable provided that it employs an application form making use of a capillary phenomenon and surface tension. The principle of the CAP coater is that, when a lower part of a nozzle having a capillary gap is submerged in resist, resist comes up in the capillary gap due to capillary phenomenon, whereby resist is ejected at a nozzle tip by a surface tension. By slowly moving a substrate directed at its application surface down in a vicinity of the nozzle tip, resist is to be applied. The disclosures of the apparatus of this kind includes, e.g. an apparatus described in U.S. Pat. Nos. 5,650,196 or 5,654,041.

Furthermore, because the graytone mask of a type for forming a precise pattern smaller than a resolution limit is cheaper as compared to a graytone mask of a type using a semi-transmission film, the graytone mask and pattern transfer method of the invention is essentially required in placing into practical application a method for inexpensively forming a large-sized greytone mask for manufacturing an LCD (liquid crystal display) (for manufacturing a color filter or thin film transistors (TFTs)) or large-sized greytone mask for manufacturing a display device such as a PDP (plasma display panel).

DETAILED DESCRIPTION OF THE PREFERRED EMBODIMENTS

Explanations will be now made on embodiments.

Embodiment 1

A Cr film was formed in a thickness of 10,000 angstroms over a glass substrate (size: 390 mm by 610 mm, 6 mm thick) polished with precision. Resist is applied onto the Cr film by the use of a CAP coater (by Hirano-techseed).

Figure 7:
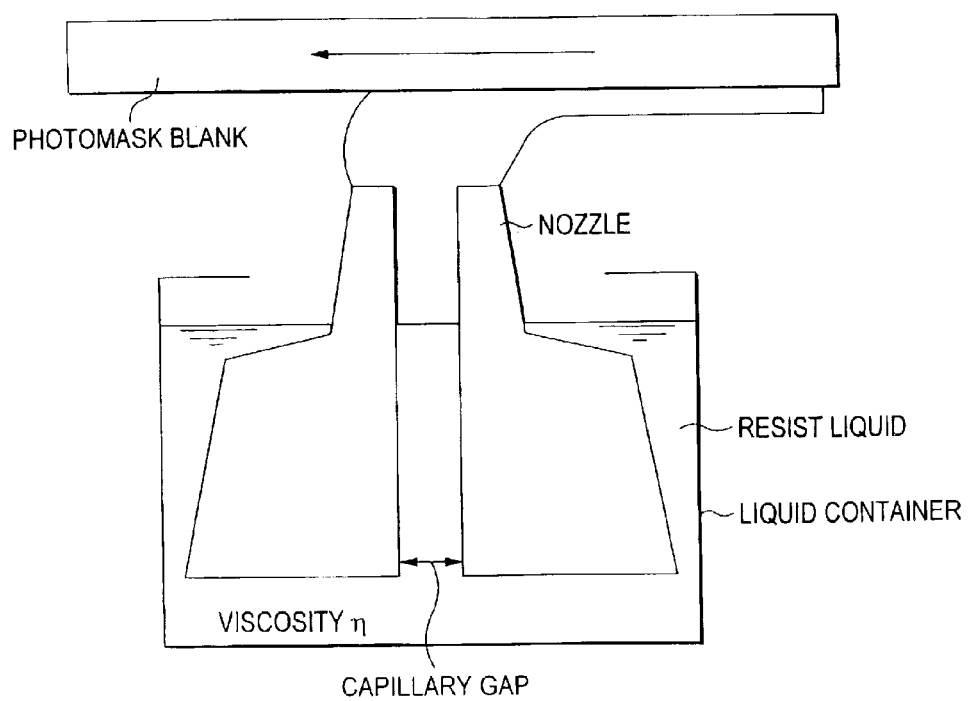
FIG. 7 is a typical view of a resist applying device used in the embodiment.

The apparatus is an apparatus as shown in FIG. 7, and has a nozzle having a capillary gap being submerged in a resist liquid filled in a liquid container. The nozzle is raised to be positioned close to a main surface of a photomask blank directed downward. By utilizing a capillary phenomenon through the capillary gap, a substrate is moved while contacting a resist liquid raised to the nozzle tip with the main surface of the photomask blank. Due to this, resist is applied onto the main surface of the photomask blank.

Figure 1:
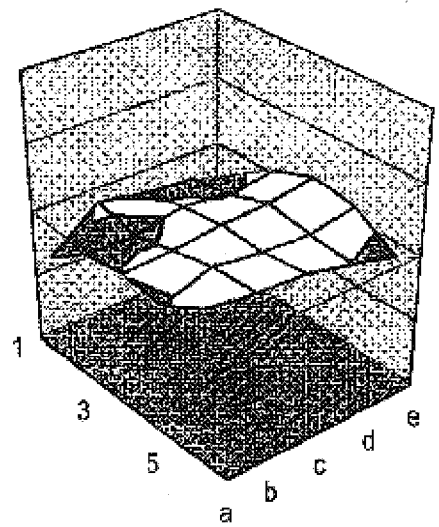
FIG. 1 is a diagram showing a result of a resist film thickness measurement in one embodiment of the present invention.

FIG. 1 shows a result of measurement of a resist-film thickness conducted at 5×5=25 points equally distributed over the entire region of a pixel area of 360×580 mm on a substrate. The on-plane distribution of resist-film thickness in the surface was ±1% or less.

Figure 5:
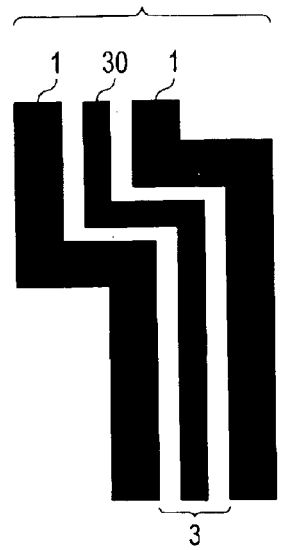
FIG. 5 is a figure showing one example of a predetermined graytone pattern in the invention.
Figure 6:
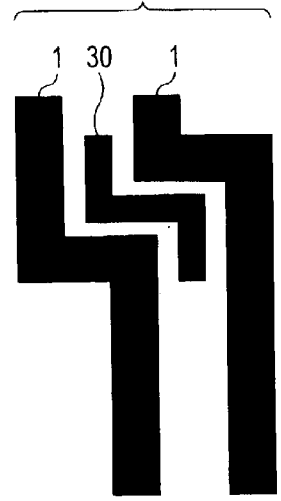
FIG. 6 is a figure showing another example of a predetermined graytone pattern in the invention.

Then, rendering (exposure to light) is made on the resist, by a pixel pattern including a graytone pattern. The resist is developed to carry out etching on the Cr film. Then, the resist is stripped away, to fabricate a graytone mask for LCD (for producing TFTs). Note that the greytone pattern used a pattern shown in FIG. 5. FIG. 5 is on the case that a graytone pattern 30 is formed in a graytone region 3 between opaque parts (opaque patterns) 1.

Figure 2:
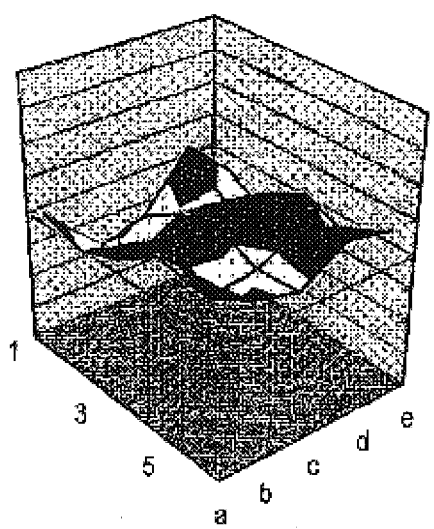
FIG. 2 is a diagram showing a result of a graytone-pattern dimensional measurement in one embodiment of the present invention.

FIG. 2 shows a result of a measurement by a CD measuring instrument on the dimensions (linewidth) of the patterns 30 arranged at 5×5=25 points equally distributed in the pixel area of 360×580 mm on the substrate. In this result, maximum value Dmax–minimum value Dmin (=range) was approximately 12% of a design dimensions D. The on-plane variations of pattern-dimensions accuracy (CD) was approximately 12% on the range. Meanwhile, all the parts of the pattern shown in FIG. 5 were clearly resolved at all the points.

COMPARATIVE EXAMPLE 1

A Cr film was formed in a thickness of 10,000 angstroms over a glass substrate (size: 390 mm by 610 mm, 6 mm thick) polished with precision. Resist was applied on the Cr film by the use of a spin coater.

Figure 3:
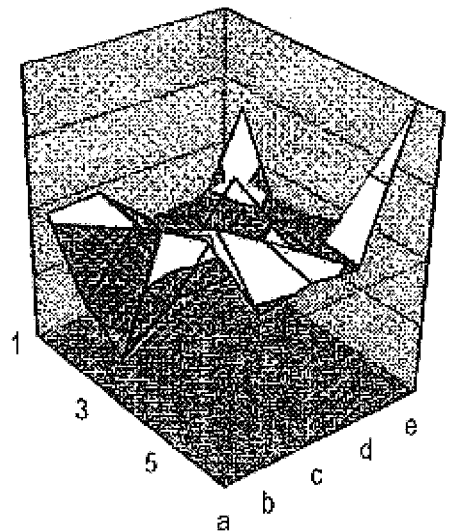
FIG. 3 is a diagram showing a result of a resist film thickness measurement in a comparative example.

FIG. 3 shows a result of measurement on resist-film thickness conducted at 5×5=25 points equally distributed over the entire region of a pixel area of 360×580 mm on the substrate. The on-plane distribution of resist-film thickness was ±2%. Meanwhile, there was observed, in FIG. 3, a tendency that film thickness is small in a central region of the substrate and gradually increased as the outer periphery is neared. Also, there was observed a phenomenon, called fringe, that film thickness is increased at the four corners of the substrate resulting from the application with rotation (rotary action).

Then, rendering (exposure to light) was conducted on the resist, by a pixel pattern including a graytone pattern similar to Embodiment 1. The resist was developed to carry out etching on the Cr film. The resist was stripped away, thus producing a graytone mask for an LCD.

Figure 4:
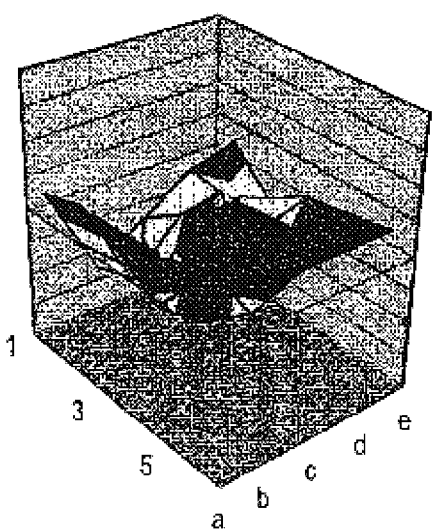
FIG. 4 is a diagram showing a result of a graytone-pattern dimensional measurement in the comparative example.

FIG. 4 shows a result of a measurement by a CD measuring instrument on the dimensions (linewidth) of the patterns 30 arranged at 5×5=25 points equally distributed in the pixel area on the substrate. In this result, maximum value Dmax−minimum value Dmin (=range) was approximately 15% of a design dimensions D. The on-plane variations of pattern dimensional accuracy (CD) were approximately 15% on the range. Meanwhile, all the parts of the pattern shown in FIG. 5 was not clealy resolved at all the points.

EMBODIMENT 2 AND COMPARATIVE EXAMPLE 2

Figure 8A:
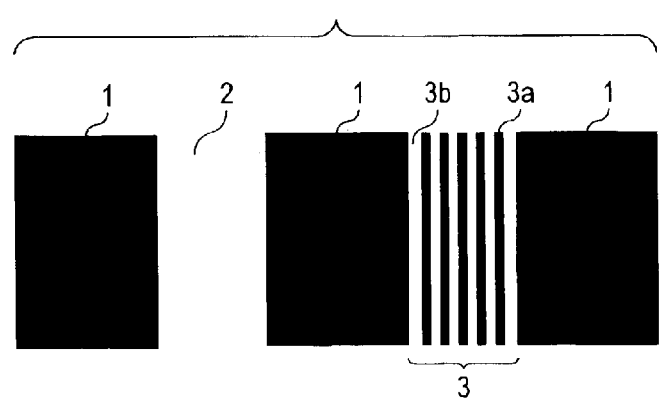
FIGS. 8A and 8B are a partial plan view and a partial sectional view for explaining a graytone mask.
Figure 8B:
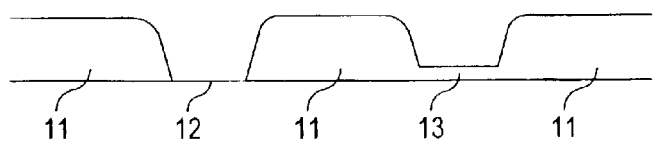

Measurement was made by the CD measuring instrument on the dimensions of a pattern of precise lines and spaces, similarly to Embodiment 1 and Comparative Example 1 except in that, in place of the pattern shown in FIG. 5, a graytone pattern having precise lines and spaces shown in FIG. 8 is arranged at 5×5=25 points equally distributed in a region of 310×510 mm for forming a graytone part on a substrate. As a result, Embodiment 2 was improved in on-plane variations of dimensional accuracy by approximately 20% in the entire region of the graytone part, as compared to Comparative Example 2. Thus, conspicuously improved was the yield in a pattern transfer process using the graytone mask, while conspicuously enhanced was the applicability of the pattern transfer process using the graytone mask.

It is noted that the present invention is not limited to the foregoing embodiments.

For example, kind and film thickness of resist and the like are to be properly selected. Also, the opaque film is not limited to Cr but known opaque materials may be properly selected and used.

Meanwhile, the predetermined graytone pattern, referred in the invention, is not limited to the pattern shown in FIG. 5. For example, an effect similar to that of Embodiment 1 was enjoyed in the case predetermined graytone patterns 30, in place of the patterns shown in FIG. 5, were formed respectively between opaque parts (opaque patterns) 1.

As explained above, according to the present invention, by suppressing an on-plane distribution of resist film thickness to ±1% or less, a predetermined graytone pattern can be satisfied with dimensional accuracy, making possible to realize a graytone mask having, at least in a part, a predetermined graytone pattern.

By suppressing the on-plane distribution of resist film thickness to ±1% or less, the on-plane variations of dimensional accuracy is improved by approximately 20%. In the case a pattern is transferred onto resist by the use of the graytone mask, the graytone part is conspicuously improved in resist film thickness variations in the entire region thereof. Accordingly, it is possible to conspicuously improve the yield in a pattern transfer process using the graytone mask and to remarkably enhance the applicability of the pattern transfer process using the graytone mask.

Meanwhile, because the graytone mask of a type for forming a precise pattern smaller than a resolution limit is cheaper as compared to a graytone mask of a type using a semi-transmission film, the graytone mask and pattern transfer method of the invention is essentially required in placing into practical application an inexpensive LCD transfer process and manufacturing method.

What is claimed is:

1. A method for producing a graytone mask for use in the process for producing a display device having a multiplicity of pixel patterns, said graytone mask having an opaque part, a light-transmission part and a graytone part as a region formed with an opaque pattern having pattern dimensions equal to or smaller than a resolution limit of an exposing apparatus using a mask to reduce an amount of exposure light transmission through the region and having said graytone part included in each pixel pattern, the method for forming the graytone mask comprising the steps of:

preparing a transparent substrate of a large-sized substrate of 330 mm or greater on one side with an opaque film thereon;

forming a resist film on the opaque film, an on-plane distribution of the resist film thickness being suppressed to ±1% or less in a region where a graytone part is to be formed;

patterning the resist film with a pattern data including graytone pattern data;

developing the resist film to form a resist pattern;

etching the opaque film with use of the resist pattern as a mask;

stripping away the resist pattern.

2. The method for producing a graytone mask according to claim 1, wherein the resist film is applied with a resist liquid raised using a capillary phenomenon through a capillary nozzle, by scanning a nozzle tip over the substrate held downward.

3. A blank for producing a graytone mask for use in the process for producing a display device having a multiplicity of pixel patterns, said graytone mask having an opaque part, a light-transmission part and a graytone part as a region formed with an opaque pattern having pattern dimensions equal to or smaller than a resolution limit of an exposing apparatus using a mask to reduce an amount of exposure light transmission through the region and wherein said graytone part is included in each pixel pattern; and wherein the blank for forming the graytone mask further comprises a large-sized transparent substrate of 330 mm or greater with an opaque film thereon, and a resist film formed on the opaque film with an on-plane distribution of the resist film thickness suppressed to ±1% or less for the entire surface of the resist film corresponding to the pixel patterns.

* * * * *